United States Patent
Liu

(10) Patent No.: US 10,784,152 B2
(45) Date of Patent: Sep. 22, 2020

(54) METHOD OF MAKING AN INTERCONNECTION BETWEEN WAFERS AFTER WAFER LEVEL STACKING, BASED ON 3D-IC TECHNOLOGY

(71) Applicant: WUHAN XINXIN SEMICONDUCTOR MANUFACTURING CO., LTD., Wuhan, Hubei (CN)

(72) Inventor: Heng Liu, Hubei (CN)

(73) Assignee: WUHAN XINXIN SEMICONDUCTOR MANUFACTURING CO., LTD., Wuhan, Hubei (CN)

( * ) Notice: Subject to any disclaimer, the term of this patent is extended or adjusted under 35 U.S.C. 154(b) by 0 days.

(21) Appl. No.: 16/397,157

(22) Filed: Apr. 29, 2019

(65) Prior Publication Data
US 2020/0144108 A1 May 7, 2020

(30) Foreign Application Priority Data
Nov. 5, 2018 (CN) .......................... 2018 1 1309447

(51) Int. Cl.
*H01L 21/768* (2006.01)
*H01L 27/146* (2006.01)

(52) U.S. Cl.
CPC .. *H01L 21/76813* (2013.01); *H01L 21/76804* (2013.01); *H01L 21/76831* (2013.01); *H01L 21/76877* (2013.01); *H01L 27/1469* (2013.01); *H01L 27/14636* (2013.01); *H01L 27/14689* (2013.01)

(58) Field of Classification Search
CPC ......... H01L 21/76804; H01L 21/76877; H01L 21/76898; H01L 23/481; H01L 21/76831
See application file for complete search history.

(56) References Cited

U.S. PATENT DOCUMENTS

| | | | |
|---|---|---|---|
| 2007/0037379 A1* | 2/2007 | Enquist | H01L 21/76898 438/618 |
| 2011/0171827 A1* | 7/2011 | Farooq | H01L 21/0337 438/653 |
| 2014/0091414 A1* | 4/2014 | Shimotsusa | H01L 21/76898 257/431 |

(Continued)

*Primary Examiner* — Ermias T Woldegeorgis
(74) *Attorney, Agent, or Firm* — Muncy, Geissler, Olds & Lowe, P.C.

(57) ABSTRACT

A manufacturing method of a semiconductor device is disclosed, including: providing a first wafer and a second wafer that are bonded, a back surface of the first substrate of the first wafer is provided with a passivation layer; performing a photolithography and etching process to form a first opening; forming a hard mask layer, the hard mask layer covers at least a sidewall surface of the first opening; performing an etching process to form a second opening; performing a photolithography and etching process to form a third opening; and forming an interconnection layer. A back surface of a first substrate is provided with a passivation layer, after a first opening is formed, a hard mask layer is formed on a sidewall surface of the first opening, and a maskless etching process is performed to form a second opening, thereby simplifying the process, eliminating one photomask and reducing the production cost.

18 Claims, 5 Drawing Sheets

(56) References Cited

U.S. PATENT DOCUMENTS

| | | | | |
|---|---|---|---|---|
| 2015/0069619 A1* | 3/2015 | Chou | ............... | H01L 27/1464 257/774 |
| 2015/0179612 A1* | 6/2015 | Tsai | ............... | H01L 23/481 257/773 |
| 2015/0348905 A1* | 12/2015 | Tsai | ............... | H01L 21/76898 257/774 |
| 2015/0348917 A1* | 12/2015 | Tsai | ............... | H01L 27/0688 257/774 |

* cited by examiner

METHOD OF MAKING AN INTERCONNECTION BETWEEN WAFERS AFTER WAFER LEVEL STACKING, BASED ON 3D-IC TECHNOLOGY

CROSS-REFERENCE TO RELATED APPLICATION

This application claims the priority of Chinese patent application number 201811309447.1, filed on Nov. 5, 2018, the entire contents of which are incorporated herein by reference.

TECHNICAL FIELD

The present invention pertains to the technical field of integrated circuit manufacturing, and in particular, relates to a manufacturing method of a semiconductor device.

BACKGROUND

In the trend of highly integrated semiconductor development, the integration of different wafers is the main development direction of semiconductor technology, and wafer level stacking based on 3D-IC technology can achieve the targets of lower cost, higher speed and higher density. After wafer bonding, how to achieve metal interconnection between wafers is an important process in semiconductor processes. At present, a first opening is first formed in the two wafers after bonding, and then a second opening and a third opening are formed (the second opening may be formed first, or the third opening may be formed first). The interconnection layer is electrically connected to metal layers in the two wafers via the first opening, the second opening and the third opening. At present, the formation of three openings (first to third openings) requires three photolithography processes (three photomasks are required) and three etching processes, so the process is complicated and high in production cost.

SUMMARY OF THE INVENTION

An objective of the present invention is to provide a manufacturing method of a semiconductor device to simplify the process and reduce the production cost.

In order to solve the above technical problems, the present invention provides a manufacturing method of a semiconductor device, including:

providing a first wafer and a second wafer that are bonded, wherein the first wafer includes a first substrate, a first dielectric layer located on a front surface of the first substrate and a first metal layer embedded in the first dielectric layer, the second wafer includes a second substrate, a second dielectric layer located on the second substrate and a second metal layer embedded in the second dielectric layer, the first dielectric layer faces the second dielectric layer, and a back surface of the first substrate is provided with a passivation layer;

performing a photolithography and etching process to form a first opening, wherein the first opening penetrates through the passivation layer and the first substrate, and the first opening is located above the first metal layer and the second metal layer;

forming a hard mask layer, wherein the hard mask layer covers at least a sidewall surface of the first opening;

performing an etching process to form a second opening, wherein the second opening penetrates through a portion of the thickness of the first dielectric layer on the bottom of the first opening, and the second opening is located above the first metal layer; in the etching process for forming the second opening, an etching rate of the passivation layer is smaller than an etching rate of the hard mask layer;

performing a photolithography and etching process to form a third opening, wherein the third opening penetrates through the first dielectric layer on the bottom of the second opening and a portion of the thickness of the second dielectric layer, and the third opening is located above the second metal layer;

performing an etching process to expose the first metal layer and the second metal layer; and forming an interconnection layer, wherein the interconnection layer is electrically connected to the second metal layer and the first metal layer via the first opening, the second opening and the third opening.

Further, the hard mask layer further covers a surface of the passivation layer and a bottom surface of the first opening.

Further, the material of the hard mask layer is a polymer.

Further, the polymer is a fluorocarbon polymer.

Further, a gas for generating the polymer is $C_4F_8$.

Further, on a cross section perpendicular to the surfaces of the first wafer and the second wafer, the cross section shape of the first opening is a rectangle, the cross section shape of the second opening is a rectangle or an inverted trapezoid, and the cross section shape of the third opening is a rectangle or an inverted trapezoid.

Further, on a cross section perpendicular to the surfaces of the first wafer and the second wafer, the maximum cross section width of the second opening is greater than or equal to the difference between the cross section width of the first opening and twice the maximum cross section width of the hard mask layer on the sidewall of the first opening.

Further, the material of the passivation layer is a silicon nitride layer, or a stacked silicon oxide layer and silicon nitride layer.

Further, the first opening further penetrates through a portion of the thickness of the first dielectric layer.

Further, the semiconductor device is a back-illuminated CMOS image sensor, wherein the first wafer is a pixel wafer, and the second wafer is a logic wafer.

According to the manufacturing method of a semiconductor device of the present invention, a back surface of a first substrate is provided with a passivation layer, after a first opening is formed, a hard mask layer is formed on a sidewall surface of the first opening, and a maskless etching process is performed to form a second opening, thereby simplifying the process, eliminating one photomask and reducing the production cost.

Figure 1:
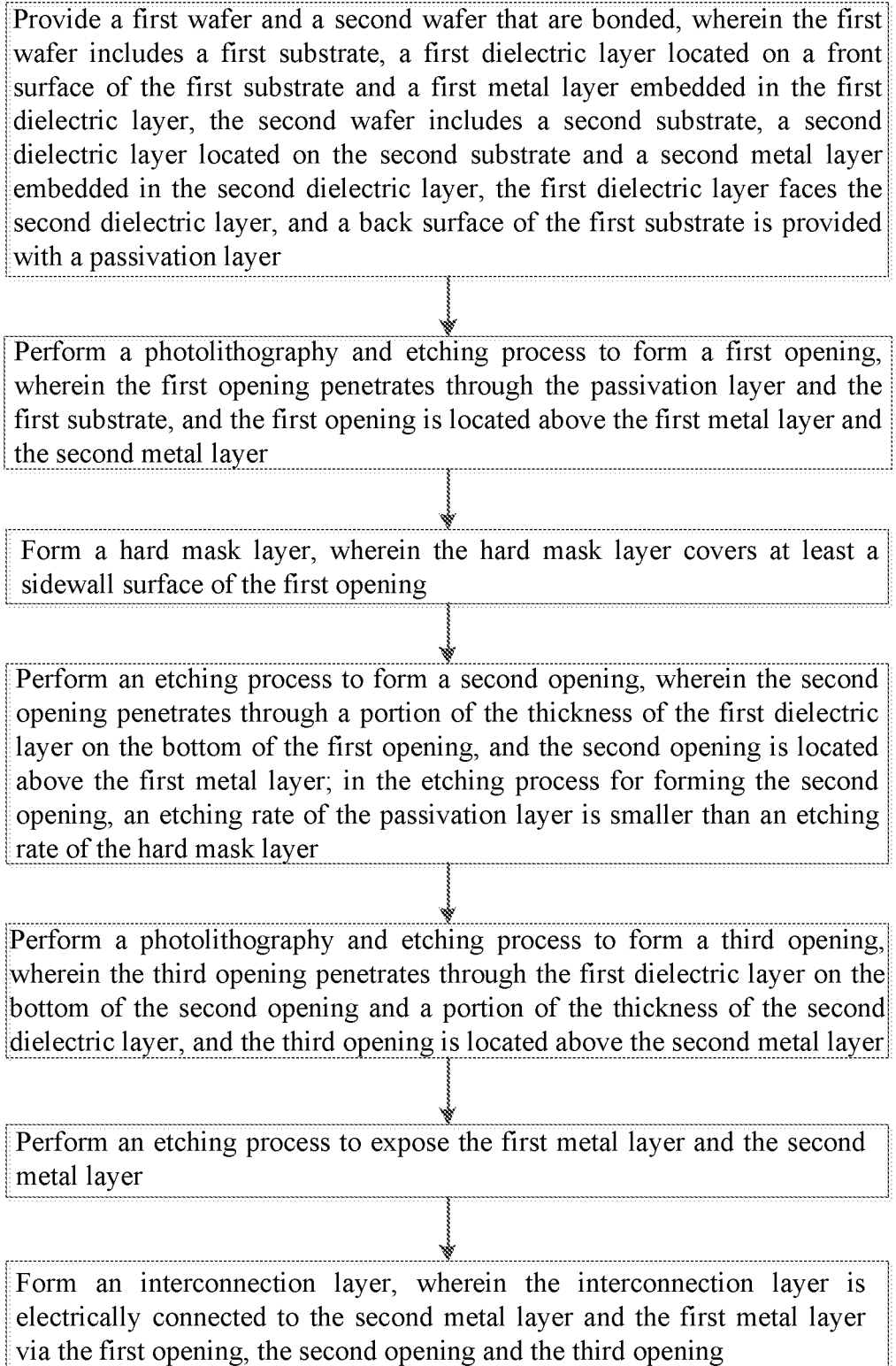
FIG. 1 is a flow chart of a manufacturing method of a semiconductor device according to an embodiment of the present invention.

The reference signs are as follows:

10—first wafer; 101—first substrate; 102—first dielectric layer; 102a—first dielectric layer first portion; 102b—first dielectric layer second portion; 103—first metal layer; 104—etching stopping layer; 105—passivation layer; 106—hard mask layer; 106a—hard mask layer of on the sidewall of the first opening; 106b—hard mask layer on the bottom of the first opening; 106c—hard mask layer on the back surface of the passivation layer;

20—second wafer; 201—second substrate; 202—second dielectric layer; 202a—second dielectric layer first portion; 202b—second dielectric layer second portion; 203—second metal layer; 204—second etching stopping layer; 205—passivation layer;

30—bonding interface;

41—first opening; 42—second opening; 43—third opening;

50—interconnection layer.

DETAILED DESCRIPTION OF THE INVENTION

As described in the Background, the two bonded wafers are required to form three openings (first to third openings) for metal interconnection, and three photolithography processes (three photomasks are required) and three etching processes are required. Specifically, the first photolithography (a photomask is required) and etching process is performed to form a first opening. A second photolithography and etching process is performed to form a third opening to expose a metal layer of a wafer, a third photolithography (a photomask is required) and etching process is performed to form a second opening to expose a metal layer of the other wafer, and finally an interconnection layer is formed. The interconnection layer is electrically connected to the metal layers in the two wafers via the first opening, the second opening and the third opening.

Here, in the process of performing the second photolithography and etching process to form the third opening, a filling layer with which the first opening is filled is firstly formed, then the filling layer is etched back such that the filling layer is flush with the surface of the wafer, a photoresist is formed on the surface of the wafer and the surface of the filling layer, the photoresist is patterned by a photolithography process (a photomask is required), and etching is performed by using the patterned photoresist as the mask to form a third opening, so the process is complicated and high in production cost. The above is an introduction of forming a third opening first and then forming a second opening. In the same way, forming a second opening first and then forming a third opening is similar, which also adopts three photolithography processes (three photomasks are required) and three etching processes, and thus, the process is complicated and high in production cost.

Based on the above research, the embodiments of the present invention provide a manufacturing method of a semiconductor device, in which a back surface of a first substrate is provided with a passivation layer, after a first opening is formed, a hard mask layer is formed on a sidewall surface of the first opening, and a maskless etching process is performed to form a second opening, which eliminates the forming of the filling layer, back etching of the filling layer and the first photolithography process for forming the second opening, thereby simplifying the process, eliminating one photomask and reducing the production cost.

The present invention will be further described in detail below with reference to the drawings and specific embodiments. Advantages and features of the present invention will become more apparent from the description. It should be noted that the drawings are in a very simplified form and are used in a non-precise scale, and are merely for convenience and clarity of the purpose of the embodiments of the present invention.

As shown in FIG. 1, the manufacturing method of a semiconductor device according to an embodiment of the present invention includes:

providing a first wafer and a second wafer that are bonded, wherein the first wafer includes a first substrate, a first dielectric layer located on a front surface of the first substrate and a first metal layer embedded in the first dielectric layer. The second wafer includes a second substrate, a second dielectric layer located on the second substrate and a second metal layer embedded in the second dielectric layer. The first dielectric layer faces the second dielectric layer, and a back surface of the first substrate is provided with a passivation layer;

performing a photolithography and etching process to form a first opening, wherein the first opening penetrates through the passivation layer and the first substrate, and the first opening is located above the first metal layer and the second metal layer;

forming a hard mask layer, wherein the hard mask layer covers at least a sidewall surface of the first opening;

performing an etching process to form a second opening, wherein the second opening penetrates through a portion of the first dielectric layer on the bottom of the first opening, and the second opening is located above the first metal layer; in the etching process for forming the second opening, an etching rate of the passivation layer is smaller than an etching rate of the hard mask layer;

performing a photolithography and etching process to form a third opening, wherein the third opening penetrates through the first dielectric layer on the bottom of the second opening and a portion of the second dielectric layer, and the third opening is located above the second metal layer;

performing an etching process to expose the first metal layer and the second metal layer; and forming an interconnection layer, wherein the interconnection layer is electrically connected to the second metal layer and the first metal layer via the first opening, the second opening and the third opening.

It should be noted that when two wafers are stacked, one wafer is always at the upper portion and the other wafer is at the lower portion, but the present invention does not limit which wafer of the first wafer and the second wafer must be placed above/below, and the positions of the upper and lower wafers can be interchanged. Herein, for the sake of simplicity and convenience of description, only one positional relationship of the two wafers is shown. Those skilled in the art can understand that all the technical contents described herein are also applicable to the case where the positions of the "first wafer" and the "second wafer" are reversed up and down. At this time, the positional relationship of the layers of the stacked semiconductor device is also reversed up and down accordingly. In some cases, preferably, during a bonding process on two wafers, a wafer having a relatively large wafer bow is placed below. However, in this case, after the wafer bonding is completed, it is also possible to determine whether to reverse up and down according to actual needs, thereby ultimately determining which wafer is above and which wafer is below.

It should be understood that the terms "first", "second", "third", "fourth" and the like are used herein to distinguish different components or techniques having the same name, and do not mean a sequence or a positional relationship or the like. In addition, for different components having the same name, such as "first substrate" and "second substrate", "first dielectric layer" and "second dielectric layer", etc., it does not mean that they have the same structure or components. For example, although not shown in the drawings, in most cases, the components formed in the "first substrate" and the "second substrate" are different, and the structures of the substrates may be different. In some implementations, the substrate may be a semiconductor substrate made of any semiconductor material (e.g., Si, SiC, SiGe, etc.) suitable for a semiconductor device. In other implementations, the substrate may also be a composite substrate such as silicon-on-insulator (SOI), silicon germanium-on-insulator, or the like. Those skilled in the art will understand that the substrate is not subject to any restrictions, but may be selected according to practical applications. Various devices (not limited to semiconductor devices) members (not shown) may be formed in the substrate. The substrate may also have been formed with other layers or members, such as gate structures, contact holes, dielectric layers, metal wires, through holes, and the like.

The manufacturing method of a semiconductor device provided by this embodiment is described in detail below with reference to FIG. 2 to FIG. 8.

Figure 2:
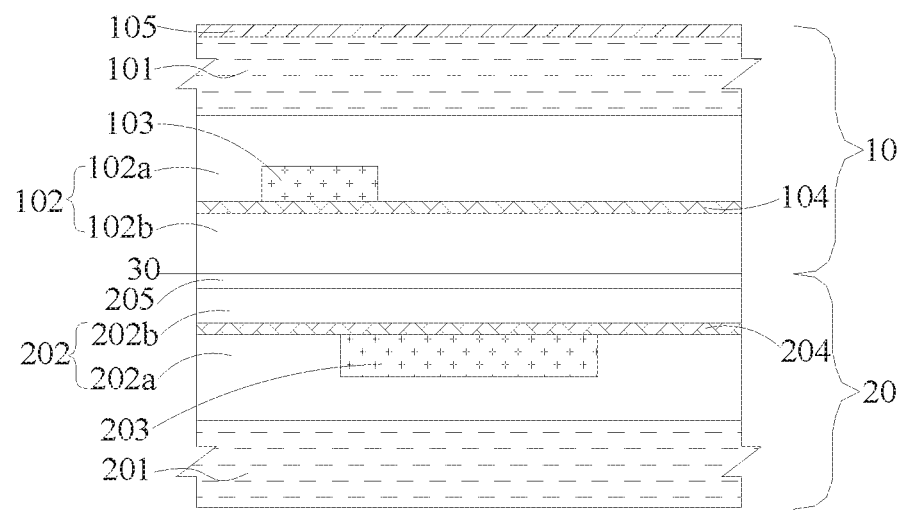
FIG. 2 is a schematic cross-sectional view of a first wafer and a second wafer that are bonded of a semiconductor device according to an embodiment of the present invention.

As shown in FIG. 2, a first wafer 10 and a second wafer 20 that are bonded are provided. The first wafer 10 includes a first substrate 101, a first dielectric layer 102 located on a front surface of the first substrate 101 and a first metal layer 103 embedded in the first dielectric layer 102. The second wafer 20 includes a second substrate 201, a second dielectric layer 202 located on the second substrate 201 and a second metal layer 203 embedded in the second dielectric layer 202. The first dielectric layer 102 faces the second dielectric layer 202 to form a bonding interface 30, and a back surface of the first substrate 101 is provided with a passivation layer 105.

Preferably, after the two wafers are bonded, the first wafer 10 and/or the second wafer 20 are/is also thinned.

The material of the first metal layer 103 and the second metal layer 203 is, for example, copper or a copper alloy.

The first dielectric layer 102 includes a first dielectric layer first portion 102a and a first dielectric layer second portion 102b, and the first metal layer 103 is embedded between the first dielectric layer first portion 102a and the first dielectric layer second portion 102b. The materials of the first dielectric layer first portion 102a and the first dielectric layer second portion 102b may be the same or different. For example, the material of the first dielectric layer first portion 102a is, for example, $SiO_2$ or other oxidized insulating media, and the material of the first dielectric layer second portion 302b is, for example, $SiO_2$ or other oxidized insulating media. The second dielectric layer 202 includes a second dielectric layer first portion 202a and a second dielectric layer second portion 202b, and the second metal layer 203 is embedded between the second dielectric layer first portion 202a and the second dielectric layer second portion 202b. The materials of the second dielectric layer first portion 202a and the second dielectric layer second portion 202b may be the same or different. For example, the material of the second dielectric layer first portion 202a is $SiO_2$ or other oxidized insulating media, and the material of the second dielectric layer second portion 202b is $SiO_2$ or other oxidized insulating media.

The first wafer 10 may further include a first etching stopping layer 104, and the first etching stopping layer 104 is located between the first metal layer 103 and the first dielectric layer second portion 102b. The second wafer 20 further includes a second etching stopping layer 204, and the second etching stopping layer 204 is located between the second metal layer 203 and the second dielectric layer second portion 202b.

Figure 3:
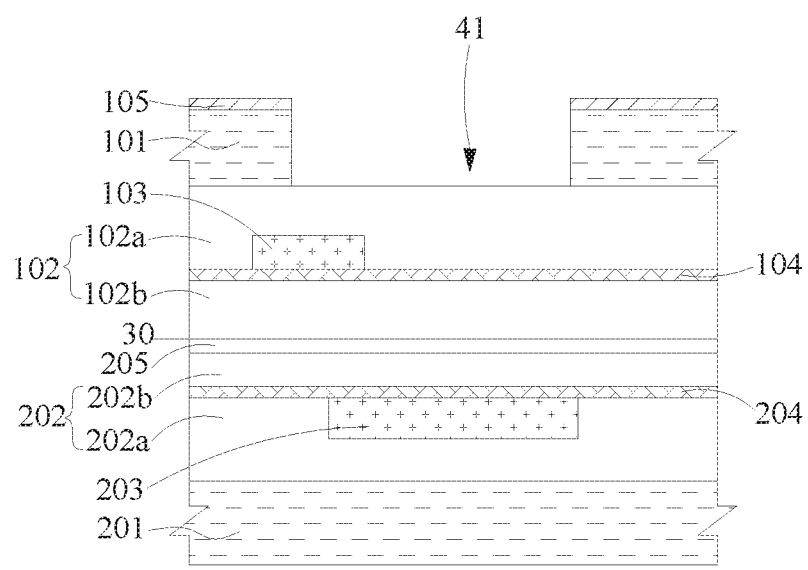
FIG. 3 is a schematic cross-sectional view of a semiconductor device after a first opening is formed according an embodiment of the present invention.

Next, as shown in FIG. 3, a first photolithography (using a first photomask) and etching process is performed to form a first opening 41. The etching process terminates at an interface between the first substrate 101 and the first dielectric layer 102, whereby the first opening 41 penetrates through the first substrate 101 to expose a portion surface of the first dielectric layer 102, and the first opening 41 is located above the first metal layer 103 and the second metal layer 203.

Optionally, the first opening 41 may further penetrate through the first substrate 101 and a portion of the first dielectric layer 102.

Figure 4:
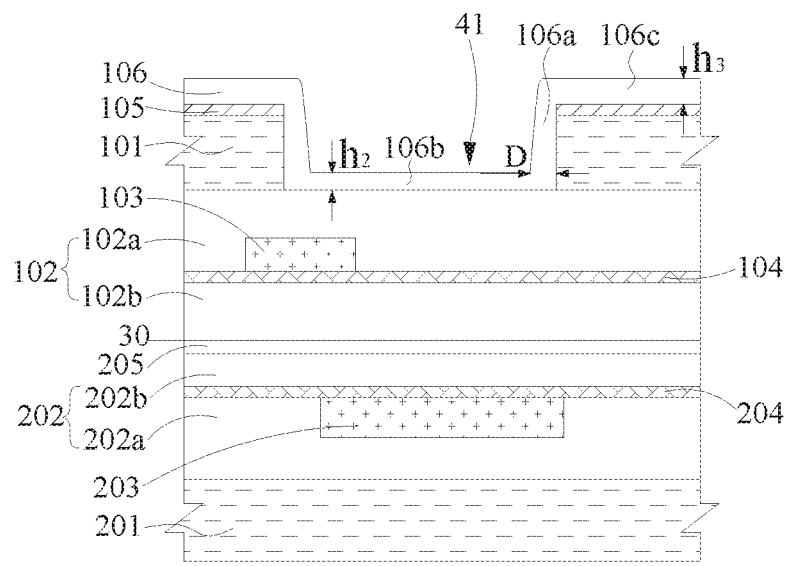
FIG. 4 is a schematic cross-sectional view of a semiconductor device after a hard mask layer is formed according to an embodiment of the present invention.

Next, as shown in FIG. 4, a hard mask layer 106 is formed. The hard mask layer 106 covers at least a sidewall surface of the first opening 41. Optionally, the hard mask layer 106 further covers a back surface of the passivation layer 105 and a bottom surface of the first opening 41. In this embodiment, the specific process of forming the hard mask layer 106 is as follows: the first wafer 10 and the second wafer 20 that are bonded are placed in a reaction chamber, a gas for generating the polymer such as $C_4F_8$ is introduced into the reaction chamber, the $C_4F_8$ forms a large amount of free radicals for free thermal movement, and a layer of polymer is grown on the sidewall surface of the first opening 41, the bottom surface of the first opening 41 and the back surface of the passivation layer 105. The polymer can serve as a hard mask layer 106. The hard mask layer 106 includes a hard mask layer 106a on the sidewall of the first opening, a hard mask layer 106b on the bottom of the first opening and a hard mask layer 106c on the back surface of the passivation layer 105. The polymer is, for example, a fluorocarbon polymer. In order to better grow the polymer on the sidewall surface of the first opening 41. On a cross section perpendicular to the surfaces of the first wafer 10 and the second wafer 20, the cross section shape of the first opening 41 is preferably a rectangle. The hard mask layer 106a on the sidewall of the first opening has a narrower top and a wider bottom, and on a cross section perpendicular to the surfaces of the first wafer and the second wafer, the maximum cross section width of the hard mask layer 106a on the sidewall of the first opening is D. Preferably, the thickness of the hard mask layer 106b on the bottom of the first opening 41 is $h_2$, $h_2$ being approximately equal to D, and the thickness of the hard mask layer 106c on the back surface of the passivation layer 105 is $h_3$, $h_3$ being usually 1 to 1.5 times $h_2$.

Figure 5:
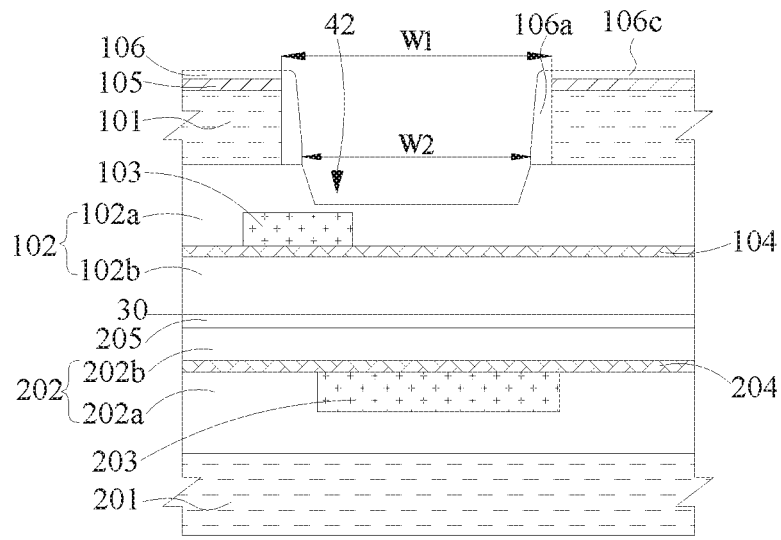
FIG. 5 is a schematic cross-sectional view of a semiconductor device after a second opening is formed according an embodiment of the present invention.

Next, as shown in FIG. 5, a second opening 42 is formed. An etching process, preferably dry etching, is performed (the etching is maskless etching). The etching process is mainly etching in the vertical direction, and rarely etching in the horizontal direction. The etching in the vertical direction removes the hard mask layer 106b on the bottom of the first opening 41 and a portion of the thickness of the first dielectric layer 102 to form a second opening 42. The second opening 42 is located above the first metal layer 103. When the second opening 42 is formed, the hard mask layer 106a on the sidewall of the first opening 41 is not substantially etched or consumed a little, as long as after a preset thickness of the first dielectric layer 102 is etched away to form a second opening 42. The hard mask layer 106a on the sidewall of the first opening 41 is just completely consumed or partially retained, that is, the hard mask layer 106a on the sidewall of the first opening 41 can be sufficient as a mask for the etching step. Further, the hard mask layer 106c on the back surface of the passivation layer 105 is also etched away partially or completely. The hard mask layer 106c on the back surface of the passivation layer 105 can prevent the passivation layer 105 from being damaged. In the etching process for forming the second opening 42, an etching rate of the passivation layer 105 is smaller than an etching rate of the hard mask layer 106. For this etching, the etching selectivity for the material of the passivation layer 105 is relatively high (i.e., the material of the passivation layer 105 is substantially not etched). Therefore, even if the surface of the passivation layer 105 does not cover the hard mask layer 106c on the back surface of the passivation layer 105, the first substrate 101 is not affected.

The passivation layer 105 is used to protect the back surface of the first substrate 101 in the etching process. Preferably, the material of the passivation layer 105 is a silicon nitride layer, and may also be a stacked silicon oxide layer and silicon nitride layer (ON stacked structure). Wherein, the silicon nitride layer is used to block the etching source during the process of forming the second opening 42 to protect the back surface of the first substrate 101. And the silicon oxide layer located between the first substrate 101 and the silicon nitride layer is used to alleviate the stress caused by the silicon nitride layer.

Preferably, the cross section (longitudinal section) shape of the second opening 42 perpendicular to the surfaces of the first wafer 10 and the second wafer 20 is controlled by design requirements and actual processes, may be a rectangle or an inverted trapezoid (a shape having a wider top and a narrower bottom), and may also be a combined shape of a rectangle and an inverted trapezoid. In addition, since a certain amount of $O_2$ is usually introduced into the dry etching gas, the fluorocarbon polymer generates an oxyfluorocarbon polymer under an $O_2$ atmosphere.

On a cross section perpendicular to the surfaces of the first wafer 10 and the second wafer 20, the maximum cross section width $W_2$ of the second opening 42 is limited to the maximum cross section width D of the hard mask layer 106a on the sidewall of the first opening 41, and the maximum cross section width D of the resulting hard mask layer 106a on the sidewall of the first opening 41 can be adjusted by adjusting and controlling the flow rate and/or reaction time of the gas for generating the polymer. Specifically, the maximum cross section width $W_2$ of the second opening 42 is greater than or equal to the difference between the cross section width $W_1$ of the first opening 41 and twice the maximum cross section width D of the hard mask layer 106a on the sidewall of the first opening 41, that is, $W_2 \geq W_1 - 2D$. After the second opening 42 is formed, the hard mask layer 106 is removed.

Figure 6:
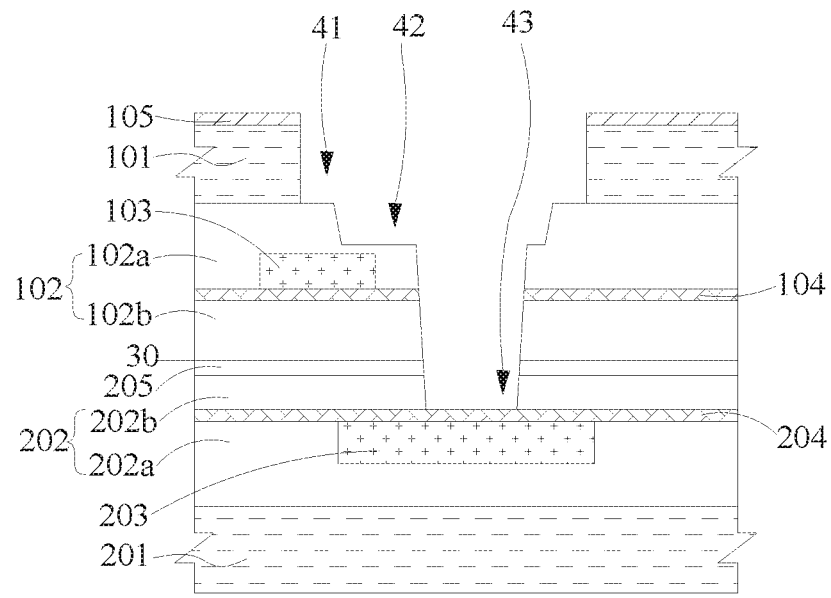
FIG. 6 is a schematic cross-sectional view of a semiconductor device after a third opening is formed according an embodiment of the present invention.

Next, as shown in FIG. 6, a photolithography (using a photomask) and etching process is performed to form a third opening 43. The third opening 43 penetrates through a portion of the first dielectric layer 102 on the bottom of the second opening 42 and a portion of the second dielectric layer 202 below the portion of the first dielectric layer 102 and stops at the second etching stopping layer 204. The third opening 43 is located above the second metal layer 203. The second opening 42 is located between the first opening 41 and the third opening 43.

Figure 7:
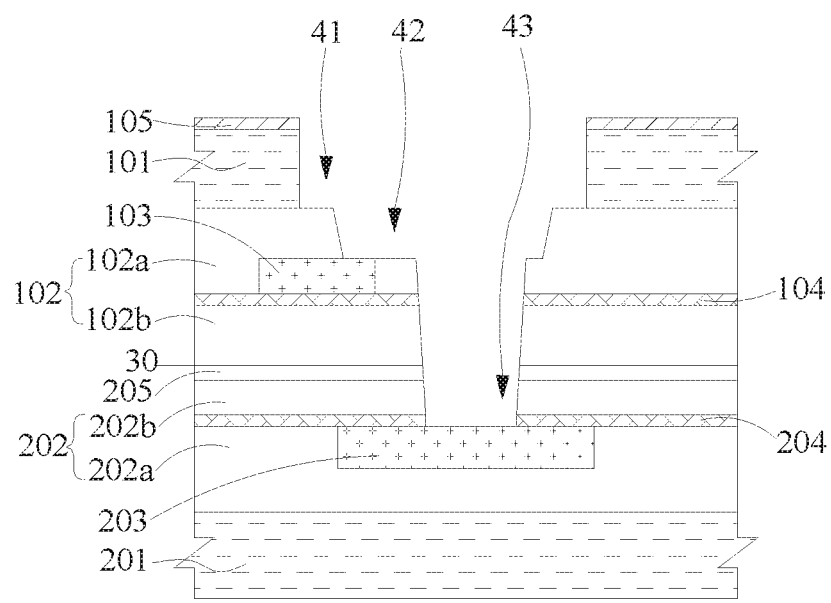
FIG. 7 is a schematic cross-sectional view of a semiconductor device after a first metal layer and a second metal layer are exposed according to an embodiment of the present invention.

Next, as shown in FIG. 7, a dry etching process is performed to expose the first metal layer 103 and the second metal layer 203. The first dielectric layer 102 on the bottom of the second opening 42 is etched to expose a portion of the first metal layer 103, and the second etching stopping layer 204 on the bottom of the third opening 43 is etched to expose a portion of the second metal layer 203.

Figure 8:
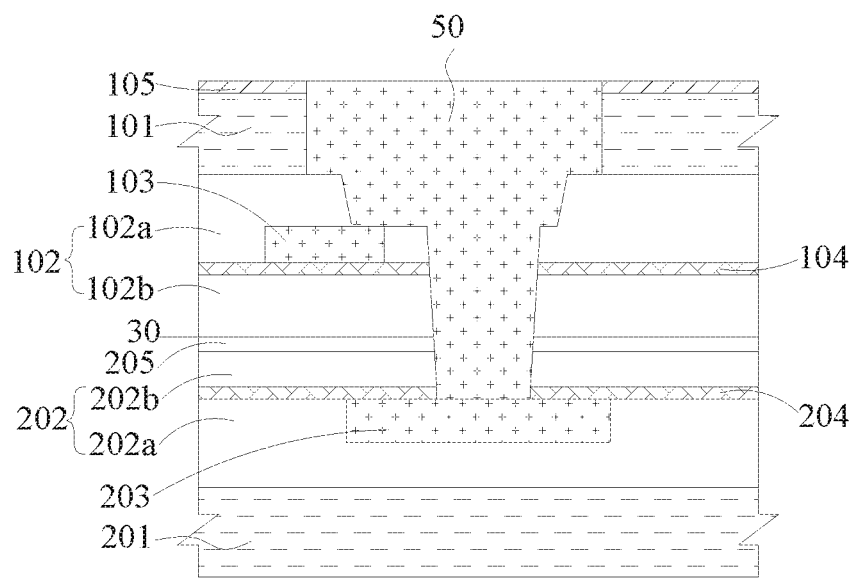
FIG. 8 is a schematic cross-sectional view of a semiconductor device after an interconnection layer is formed according to an embodiment of the present invention.

Next, as shown in FIG. 8, an interconnection layer 50 is formed. The interconnection layer 50 is electrically connected to the second metal layer 203 and the first metal layer 103 via the first opening 41, the second opening 42 and the third opening 43 to realize metal interconnection between the two wafers. The interconnection layer 50 also covers the surface of the passivation layer 105. Thereafter, a chemical mechanical polishing process is performed to remove a portion of the interconnection layer 50 on the surface of the passivation layer 105 and planarize the interconnection layer 50 in the first opening 41. The material of the interconnection layer 50 is a conductive material, which may be copper or a copper alloy, and may be formed by filling by an electroplating process. Preferably, an isolation layer (not shown) is formed on the sidewall of the first opening 41. The isolation layer is used to protect the sidewall of the first substrate 101 exposed by the first opening 41 to prevent the interconnection layer 50 from being diffused into the first substrate 101.

Preferably, the semiconductor device is, for example, a back-illuminated CMOS image sensor, wherein the first wafer is a pixel wafer, and the second wafer is a logic wafer.

In summary, according to the manufacturing method of a semiconductor device provided by the present invention, a back surface of a first substrate is provided with a passivation layer, after a first opening is formed, a hard mask layer is formed on a sidewall surface of the first opening, and a maskless etching process is performed to form a second opening (second etching of an opening). Compared with the prior art, after forming the first opening, before etching to form the third opening (second etching of an opening), four steps are required: the first opening is first filled to make the surface of the wafer flush, the filling layer is etched back, then a photoresist is formed on the surface of the wafer, and the photoresist is patterned by photolithography with a photomask. The present invention simplifies the process, eliminates one photomask and reduces the production cost.

The above description is only for the description of the preferred embodiments of the present invention, and is not intended to limit the scope of the present invention. Any changes and modifications made by those skilled in the art in light of the above disclosure are all within the scope of the appended claims.

What is claimed is:

1. A manufacturing method of a semiconductor device, comprising:
   providing a first wafer and a second wafer, wherein the first wafer comprises a first substrate, a first dielectric layer located on a front surface of the first substrate and a first metal layer embedded in the first dielectric layer, the second wafer comprises a second substrate, a second dielectric layer located on the second substrate and a second metal layer embedded in the second dielectric layer, the first dielectric layer and the second dielectric layer being bonded to each other, and a back surface of the first substrate being provided with a passivation layer;

performing a photolithography and etching process to form a first opening, wherein the first opening penetrates through the passivation layer and the first substrate, and the first opening located above the first metal layer and the second metal layer;

forming a hard mask layer, wherein the hard mask layer covers at least a sidewall surface of the first opening;

performing an etching process to form a second opening, wherein the second opening penetrates through a portion of the first dielectric layer on a bottom surface of the first opening, and the second opening located above the first metal layer, wherein in the etching process for forming the second opening, an etching rate of the passivation layer is smaller than an etching rate of the hard mask layer;

performing a photolithography and etching process to form a third opening, wherein the third opening penetrates through a portion of the first dielectric layer on a bottom of the second opening and a portion of the second dielectric layer, and the third opening located above the second metal layer;

performing an etching process to expose a portion of the first metal layer and a portion of the second metal layer; and forming an interconnection layer, wherein the interconnection layer is electrically connected to the second metal layer and the first metal layer via the first opening, the second opening and the third opening.

2. The manufacturing method of a semiconductor device according to claim 1, wherein the first opening perpendicular to a surface of the first wafer has a cross section shape of a rectangle, the second opening perpendicular to the surface of the first wafer has a cross section shape of a rectangle or an inverted trapezoid, and the third opening perpendicular to a surface of the second wafer has a cross section shape of a rectangle or an inverted trapezoid.

3. The manufacturing method of a semiconductor device according to claim 2, wherein a maximum cross section width of the second opening perpendicular to the surface of the first wafer is greater than or equal to a difference between a cross section width of the first opening perpendicular to the surface of the first wafer and twice a maximum cross section width of the hard mask layer on the sidewall of the first opening.

4. The manufacturing method of a semiconductor device according to claim 3, wherein the hard mask layer on the bottom surface of the first opening has a thickness of equal to the maximum cross section width of the hard mask layer on the sidewall of the first opening.

5. The manufacturing method of a semiconductor device according to claim 4, wherein the hard mask layer on a surface of the passivation layer has a thickness of 1 to 1.5 times the thickness of the hard mask layer on the bottom of the first opening.

6. The manufacturing method of a semiconductor device according to claim 1, wherein the hard mask layer is made of a polymer.

7. The manufacturing method of a semiconductor device according to claim 6, wherein the polymer is a fluorocarbon polymer.

8. The manufacturing method of a semiconductor device according to claim 6, wherein a gas for generating the polymer is $C_4F_8$.

9. The manufacturing method of a semiconductor device according to claim 1, wherein the first dielectric layer comprises a first dielectric layer first portion and a first dielectric layer second portion, and the first metal layer located between the first dielectric layer first portion and the first dielectric layer second portion.

10. The manufacturing method of a semiconductor device according to claim 9, wherein the first wafer further comprises a first etching stopping layer, and the first etching stopping layer located between the first metal layer and the first dielectric layer second portion.

11. The manufacturing method of a semiconductor device according to claim 1, wherein the second dielectric layer comprises a second dielectric layer first portion and a second dielectric layer second portion, and the second metal layer located between the second dielectric layer first portion and the second dielectric layer second portion.

12. The manufacturing method of a semiconductor device according to claim 11, wherein the second wafer further comprises a second etching stopping layer, and the second etching stopping layer located between the second metal layer and the second dielectric layer second portion.

13. The manufacturing method of a semiconductor device according to claim 1, wherein the hard mask layer further covers a surface of the passivation layer and the bottom surface of the first opening.

14. The manufacturing method of a semiconductor device according to claim 1, wherein the passivation layer is made of a silicon nitride layer, or a stacked silicon oxide layer and silicon nitride layer.

15. The manufacturing method of a semiconductor device according to claim 1, wherein the first opening further penetrates through a portion of the first dielectric layer.

16. The manufacturing method of a semiconductor device according to claim 1, wherein the semiconductor device is a back-illuminated CMOS image sensor.

17. The manufacturing method of a semiconductor device according to claim 1, wherein the first wafer is a pixel wafer and the second wafer is a logic wafer.

18. The manufacturing method of a semiconductor device according to claim 1, wherein the etching process for forming the second opening is a maskless etching process.

* * * * *